US010636490B1

(12) United States Patent
Lin et al.

(10) Patent No.: US 10,636,490 B1
(45) Date of Patent: Apr. 28, 2020

(54) DECODING METHOD, MEMORY CONTROL CIRCUIT UNIT AND MEMORY STORAGE DEVICE

(71) Applicant: PHISON ELECTRONICS CORP., Miaoli (TW)

(72) Inventors: Yu-Hsiang Lin, Yunlin County (TW); Shao-Wei Yen, Kaohsiung (TW); Cheng-Che Yang, New Taipei (TW); Kuo-Hsin Lai, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 16/294,938

(22) Filed: Mar. 7, 2019

(30) Foreign Application Priority Data

Jan. 23, 2019 (TW) ............... 108102585 A

(51) Int. Cl.
*G11C 16/08* (2006.01)
*G11C 16/26* (2006.01)
*G11C 16/16* (2006.01)

(52) U.S. Cl.
CPC ............ *G11C 16/08* (2013.01); *G11C 16/16* (2013.01); *G11C 16/26* (2013.01)

(58) Field of Classification Search
CPC ................................ G11C 16/08; G11C 16/26
USPC ....................................... 365/185.18, 185.12
See application file for complete search history.

(56) References Cited

U.S. PATENT DOCUMENTS

| 8,576,625 | B1* | 11/2013 | Yang | G11C 16/26 |
| | | | | 365/185.09 |
| 9,563,502 | B1* | 2/2017 | Alhussien | G11C 16/28 |
| 9,563,503 | B2* | 2/2017 | Seo | G06F 11/1068 |
| 9,601,205 | B2* | 3/2017 | Yoo | G11C 16/10 |
| 9,773,565 | B1* | 9/2017 | Yeh | G11C 16/26 |
| 10,115,468 | B2* | 10/2018 | Zeng | G11C 16/26 |
| 10,534,665 | B2* | 1/2020 | Lin | G11C 29/52 |
| 10,558,522 | B2* | 2/2020 | Tao | G11C 29/52 |

FOREIGN PATENT DOCUMENTS

| TW | I628660 | 7/2018 |
| TW | I648676 | 1/2019 |

OTHER PUBLICATIONS

"Office Action of Taiwan Counterpart Application," dated Dec. 16, 2019, p. 1-p. 7.

* cited by examiner

*Primary Examiner* — Son L Mai
(74) *Attorney, Agent, or Firm* — JCIPRNET

(57) ABSTRACT

A decoding method, a memory control circuit unit, and a memory storage device are provided. The method includes: configuring a plurality of read voltage categories, wherein the read voltage categories respectively have a plurality of representative read voltage sets; reading a first physical programming unit according to the representative read voltage sets and executing a decoding operation to obtain a plurality of decoded information; choosing a first read voltage category according to the plurality of decoded information; and reading the first physical programming unit according to the first read voltage sets in the first read voltage category and executing the decoding operation.

24 Claims, 13 Drawing Sheets

| Lower physical programming unit | Middle physical programming unit | Upper physical programming unit |
|---|---|---|
| 0 | 1 | 2 |
| 3 | 4 | 5 |
| 6 | 7 | 8 |
| 9 | 10 | 11 |
| 12 | 13 | 14 |
| ⋮ | ⋮ | ⋮ |
| 255 | 256 | 257 |

FIG. 10

DECODING METHOD, MEMORY CONTROL CIRCUIT UNIT AND MEMORY STORAGE DEVICE

CROSS-REFERENCE TO RELATED APPLICATION

This application claims the priority benefit of Taiwan application serial no. 108102585, filed on Jan. 23, 2019. The entirety of the above-mentioned patent application is hereby incorporated by reference herein and made a part of this specification.

BACKGROUND

Technical Field

The invention relates to a decoding method, a memory control circuit unit, and a memory storage device.

Description of Related Art

The markets of digital cameras, cellular phones, and MP3 players have expanded rapidly in recent years, resulting in escalated demand for storage media by consumers. Owing to the characteristics of data non-volatility, low power consumption, compact size, and having no mechanical structure exhibited by the rewritable non-volatile memory module (e.g., flash memory), the rewritable non-volatile memory module is ideal for being built in the portable multi-media devices mentioned above.

In general, when data is read from a rewritable non-volatile memory module by using a read voltage, a memory management circuit may decode the read data to obtain data intended to be read. However, when decoding fails, the memory management circuit may execute a retry-read mechanism to obtain another read voltage set and perform reading again by using the another read voltage set to obtain and decode the read data again. The memory management circuit may execute the decoding operation according to validation bits that are obtained again to obtain another decoded data formed by a plurality of decoded bits. The retry-read mechanism carried out by obtaining a read voltage set again may be repetitively executed until the number of times of execution exceeds a preset number of times. When the number of times of executing the retry-read mechanism exceeds the preset number of times, the memory management circuit may execute the decoding operation in a way other than the retry-read mechanism.

In particular, as the manufacturing process of the rewritable non-volatile memory module progresses, there are more and more read voltage sets for the retry-read mechanism. Therefore, it has already taken a certain amount of time when the number of times of executing the retry-read mechanism exceeds the preset number of times. Hence, how to reduce the execution time of decoding has become an issue for researchers in the technical field to work on.

SUMMARY

Exemplary embodiments of the invention provide a decoding method, a memory control circuit unit, and a memory storage device able to avoid a waste of time resulting from executing the retry-read mechanism by using all the read voltage sets.

An exemplary embodiment of the invention provides a decoding method for a rewritable non-volatile memory module. The rewritable non-volatile memory module has a plurality of physical erasing units, and each physical erasing unit of the physical erasing units has a plurality of physical programming units. The decoding method includes: configuring a plurality of read voltage categories, wherein each read voltage category of the read voltage categories includes a plurality of read voltage sets, and each read voltage category of the read voltage categories has a representative read voltage set; reading a first physical programming unit according to the representative read voltage sets and executing a decoding operation to obtain a plurality of decoded information; choosing a first read voltage category in the read voltage categories according to the plurality of decoded information; and reading the first physical programming unit according to the read voltage sets in the first read voltage category and executing the decoding operation.

An exemplary embodiment of the invention provides a memory control circuit unit for a rewritable non-volatile memory module. The rewritable non-volatile memory module has a plurality of physical erasing units, each physical erasing unit of the physical erasing units has a plurality of physical programming units. The memory control circuit unit includes a host interface, a memory interface, and a memory management circuit. The host interface is configured to be coupled to a host system. The memory interface is configured to be coupled to the rewritable non-volatile memory module. The memory management circuit is coupled to the host interface and the memory interface. The memory management circuit is configured to execute the following: configuring a plurality of read voltage categories, wherein each read voltage category of the read voltage categories includes a plurality of read voltage sets, and each read voltage category of the read voltage categories has a representative read voltage set; reading a first physical programming unit according to the representative read voltage sets and executing a decoding operation to obtain a plurality of decoded information; choosing a first read voltage category in the read voltage categories according to the plurality of decoded information; and reading the first physical programming unit according to the read voltage sets in the first read voltage category and executing the decoding operation.

An exemplary embodiment of the invention provides a memory storage device. The memory storage device includes a connection interface unit, a rewritable non-volatile memory module, and a memory control circuit unit. The connection interface unit is coupled to a host system. The rewritable non-volatile memory module has a plurality of physical erasing units, and each physical erasing unit of the physical erasing units has a plurality of physical programming units. The memory control circuit unit is coupled to the connection interface unit and the rewritable non-volatile memory module. The memory control circuit unit is configured to execute the following: configuring a plurality of read voltage categories, wherein each read voltage category of the read voltage categories includes a plurality of read voltage sets, and each read voltage category of the read voltage categories has a representative read voltage set; reading a first physical programming unit according to the representative read voltage sets and executing a decoding operation to obtain a plurality of decoded information; choosing a first read voltage category in the read voltage categories according to the plurality of decoded information; and reading the first physical programming unit according to the read voltage sets in the first read voltage category and executing the decoding operation.

In view of the foregoing, the decoding method, the memory control circuit unit, and the memory storage device according to the embodiments of the invention are able to categorize the read voltage sets for the retry-read mechanism to obtain the read voltage categories and choose a suitable read voltage category from the read voltage categories to execute the retry-read mechanism, thereby avoiding a waste of time resulting from executing the retry-read mechanism using all the read voltage sets.

To make the aforementioned and other features of the disclosure more comprehensible, several embodiments accompanied with drawings are described in detail as follows.

It should be understood, however, that this Summary may not contain all of the aspects and embodiments of the present disclosure, is not meant to be limiting or restrictive in any manner, and that the disclosure as disclosed herein is and may be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 10 is a schematic diagram illustrating a physical erasing unit according to the exemplary embodiment.

DETAILED DESCRIPTION OF DISCLOSED EMBODIMENTS

Figure 1:
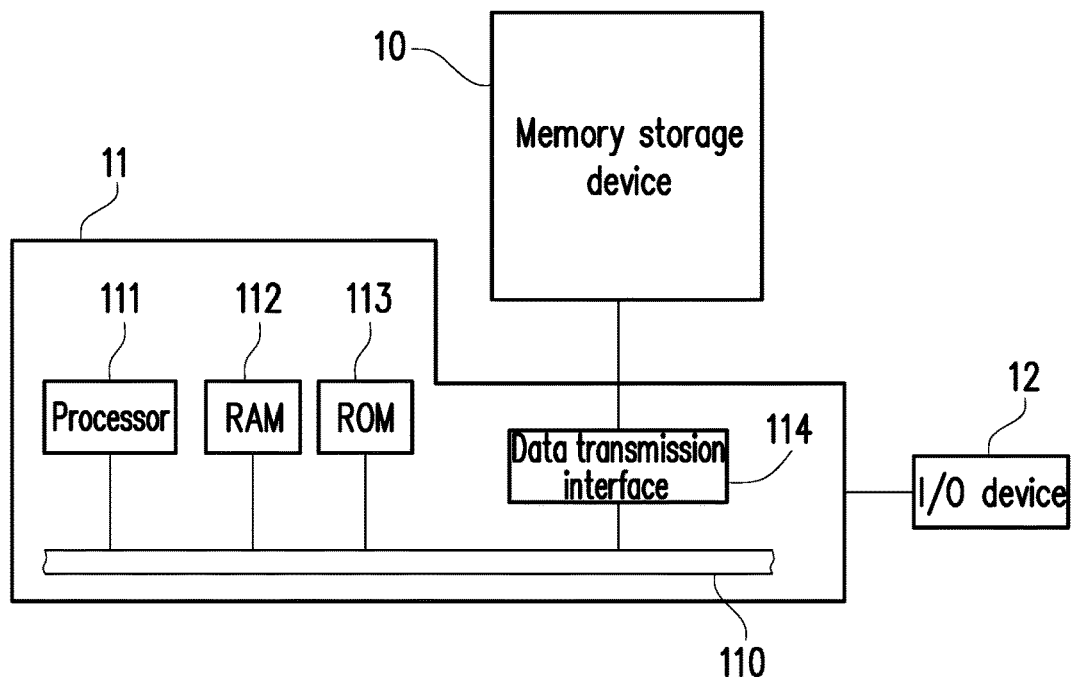
FIG. 1 is a schematic diagram of a host system, a memory storage device, and an input/output (I/O) device according to an exemplary embodiment of the disclosure.

Reference may now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" may be used interchangeably herein.

Generally, a memory storage device (also referred to as a memory storage system) includes a rewritable non-volatile memory module and a controller (also referred to as a control circuit). The memory storage device is normally used together with a host system, allowing the host system to write data to the memory storage device or read data from the memory storage device.

Figure 2:
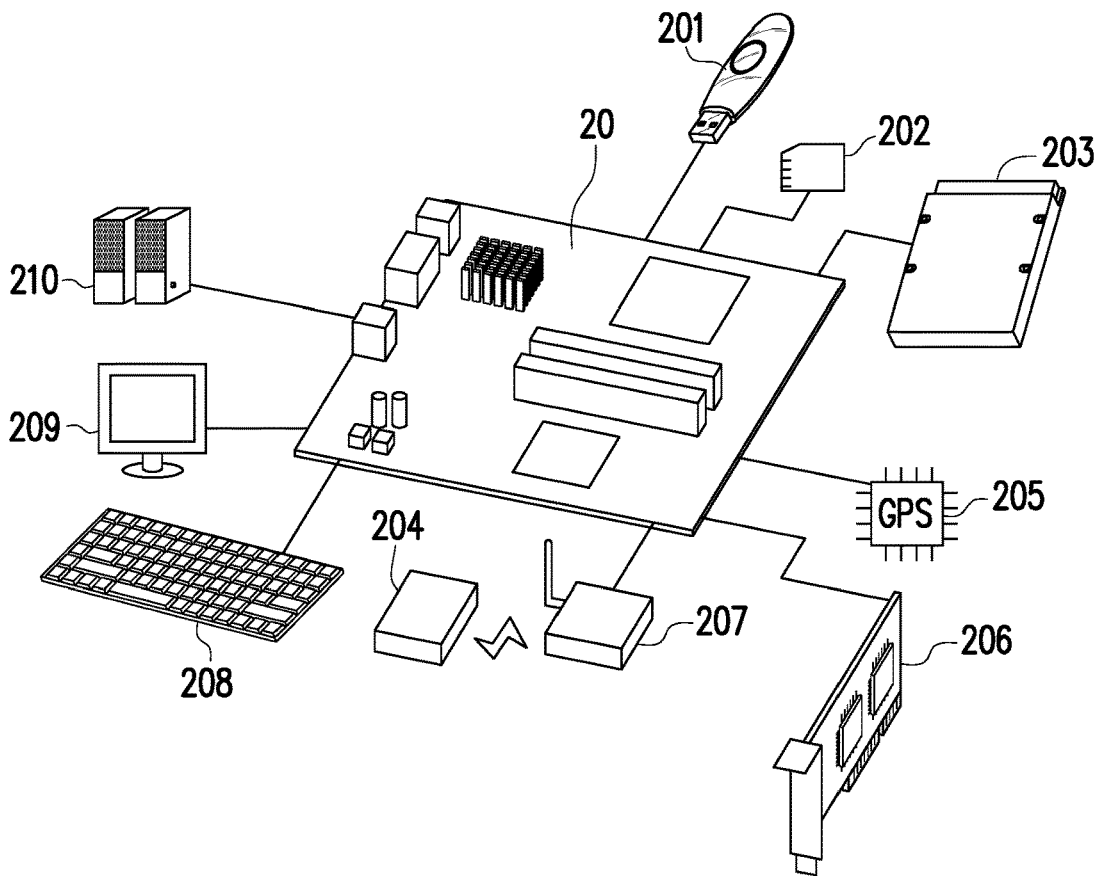
FIG. 2 is a schematic diagram of a host system, a memory storage device, and an I/O device according to another exemplary embodiment of the disclosure.

FIG. 1 is a schematic diagram of a host system, a memory storage device, and an input/output (I/O) device according to an exemplary embodiment of the disclosure. FIG. 2 is a schematic diagram of a host system, a memory storage device, and an I/O device according to another exemplary embodiment of the disclosure.

Referring to FIG. 1 and FIG. 2, a host system 11 normally includes a processor 111, a random access memory (RAM) 112, a read only memory (ROM) 113, and a data transmission interface 114. The processor 111, the random access memory 112, the read only memory 113, and the data transmission interface 114 are all coupled to a system bus 110.

In the exemplary embodiment, the host system 11 is coupled to a memory storage device 10 through the data transmission interface 114. For example, the host system 11 may store data to the memory storage device 10 or read data from the memory storage device 10 via the data transmission interface 114. In addition, the host system 11 is coupled to an I/O device 12 through the system bus 110. For example, the host system 11 may transmit an output signal to the I/O device 12 or receive an input signal from the I/O device 12 via the system bus 110.

In the exemplary embodiment, the processor 111, the random access memory 112, the read-only memory 113, and the data transmission interface 114 may be disposed on a motherboard 20 of the host system 11. The number of data transmission interfaces 114 may be one or more. The motherboard 20 may be coupled to the memory storage device 10 via a wired or a wireless method through the data transmission interface 114. The memory storage device 10 may be, for example, a flash drive 201, a memory card 202, a Solid State Drive (SSD) 203, or a wireless memory storage device 204. The wireless memory storage device 204 may be, for example, a Near Field Communication (NFC) memory storage device, a wireless fidelity (WiFi) memory storage device, a Bluetooth memory storage device, a Bluetooth low energy (BLE) memory storage device (e.g., iBeacon), or other memory storage devices based on various types of wireless communication technologies. In addition, the motherboard 20 may also be coupled to a Global Positioning System (GPS) module 205, a network interface card 206, a wireless transmission device 207, a keyboard 208, a screen 209, a speaker 210, or other types of I/O devices through the system bus 110. For example, in an exemplary embodiment, the motherboard 20 may access the wireless memory storage device 204 through the wireless transmission device 207.

Figure 3:
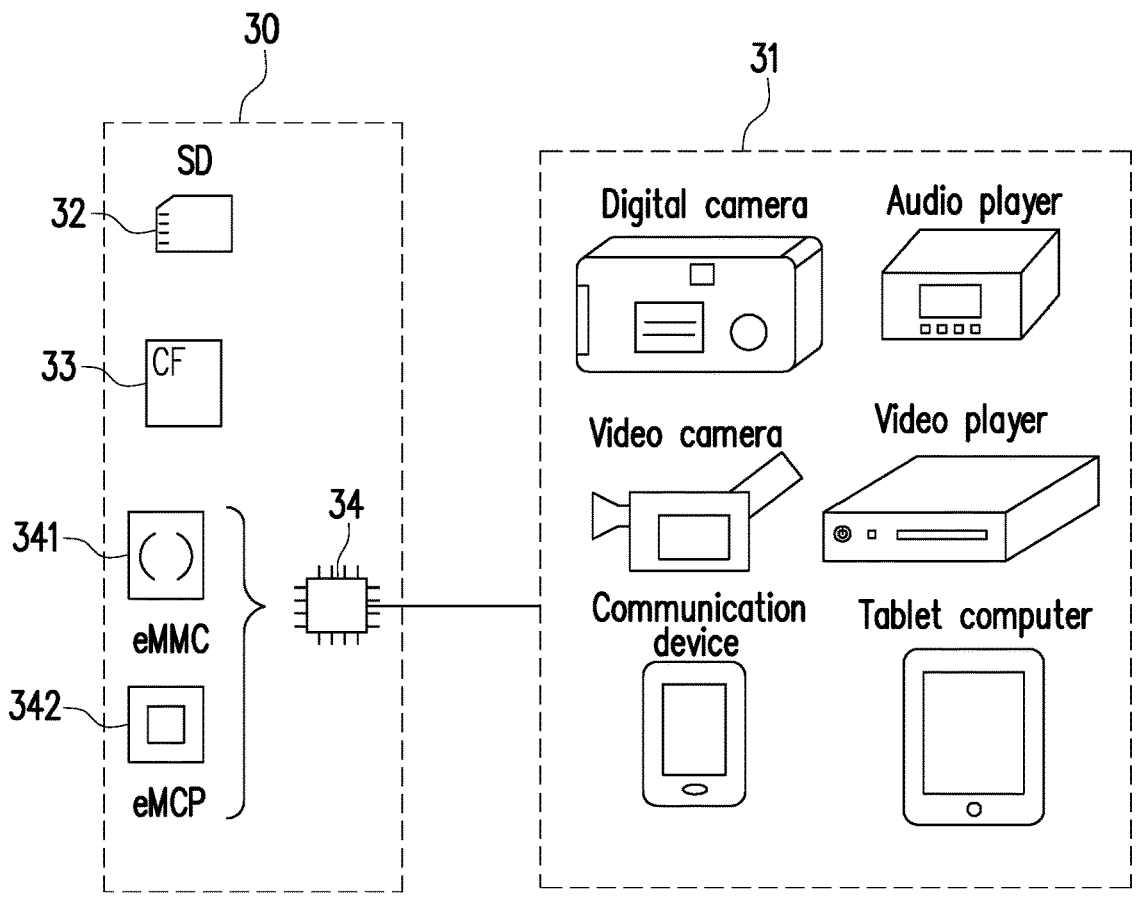
FIG. 3 is a schematic diagram of a host system and a memory storage device according to another exemplary embodiment of the disclosure.

In an exemplary embodiment, the host system mentioned may be any system that may substantially work with a memory storage device to store data. Although in the exemplary embodiments above, a computer system is used as the host system for illustration, FIG. 3 is a schematic diagram of a host system and a memory storage device according to another exemplary embodiment of the disclosure. Referring to FIG. 3, in another exemplary embodiment, a host system 31 may also be a digital camera, a video camera, a communication device, an audio player, a video player, a tablet computer, or other systems. A memory storage device 30 may be a SD card 32, a CF card 33, an embedded storage device 34, or other types of non-volatile memory storage devices used by the host system 31. The embedded storage device 34 includes an embedded MMC (eMMC) 341, and/or an embedded Multi Chip Package (eMCP) storage device 342, or various types of embedded storage devices which directly couple a memory module onto a substrate of a host system.

Figure 4:
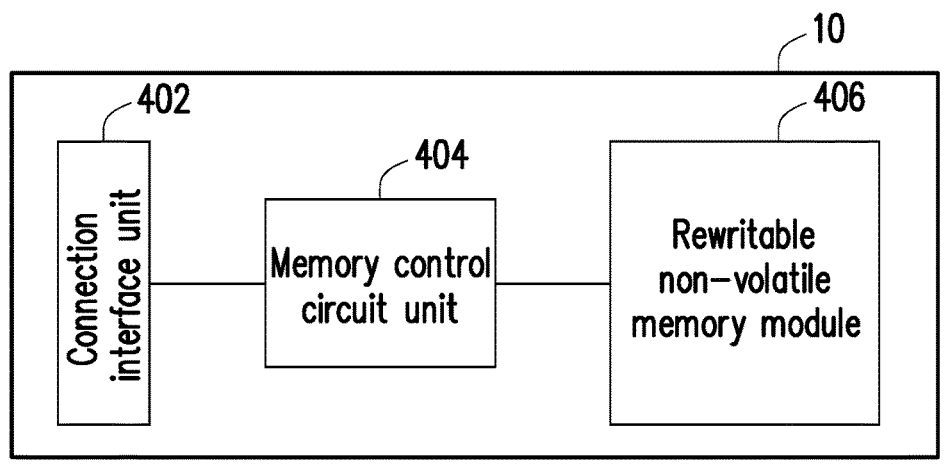
FIG. 4 is a functional block diagram of a memory storage device according to an exemplary embodiment of the disclosure.

FIG. 4 is a functional block diagram of a memory storage device according to an exemplary embodiment of the disclosure.

Referring to FIG. 4, the memory storage device 10 includes a connection interface unit 402, a memory control circuit unit 404, and a rewritable non-volatile memory module 406.

In the exemplary embodiment, the connection interface unit 402 is compatible with the Serial Advanced Technology Attachment (SATA) standard. However, it must be understood that the disclosure is not limited thereto. The connection interface unit 402 may also be compatible with the Parallel Advanced Technology Attachment (PATA) standard, the Institute of Electrical and Electronic Engineers (IEEE) 1394 standard, the Peripheral Component Interconnect Express (PCI Express) standard, the Universal Serial Bus (USB) standard, the Secure Digital (SD) interface standard, the Ultra High Speed-I (UHS-I) interface standard, the Ultra High Speed II (UHS-II) interface standard, the Memory Stick (MS) interface standard, the Multi-chip Package (MCP) interface standard, the Multimedia card (MMC) interface standard, the embedded MMC (eMMC) interface standard, the Universal Flash Storage (UFS) interface standard, the embedded Multi-chip Package (eMCP) interface standard, the Compact Flash (CF) interface standard, the Integrated Device Electronics (IDE) standard, or other suitable standards. The connection interface unit 402 may be packaged in one chip with the memory control circuit unit 404 or the connection interface unit 402 may be disposed outside a chip containing the memory control circuit unit 404.

The memory control circuit unit 404 is configured to perform multiple logic gates or control commands implemented using a hardware type or a firmware type and execute operations such as writing, reading, and erasing of data in the rewritable non-volatile memory module 406 according to the command of the host system 11.

The rewritable non-volatile memory module 406 is coupled to the memory control circuit unit 404 and is configured to store data written by the host system 11. The rewritable non-volatile memory module 406 may be a Single Level Cell (SLC) NAND flash memory module (i.e., a flash memory module which stores 1-bit in one memory cell), a Multi Level Cell (MLC) NAND flash memory module (i.e., a flash memory module which stores 2-bits in one memory cell), a Triple Level Cell (TLC) NAND flash memory module (i.e., a flash memory module which stores 3-bits in one memory cell), other flash memory modules, or other memory modules with the same characteristic.

The memory cells of the rewritable non-volatile memory module 406 are arranged into an array. In the following, the memory cell array is described as a two-dimensional memory cell array. However, it should be noted that the following exemplary embodiment merely describes an example of the memory cell array. In other exemplary embodiments, the arrangement of the memory cell array may be modified to meet practical needs.

Figure 5:
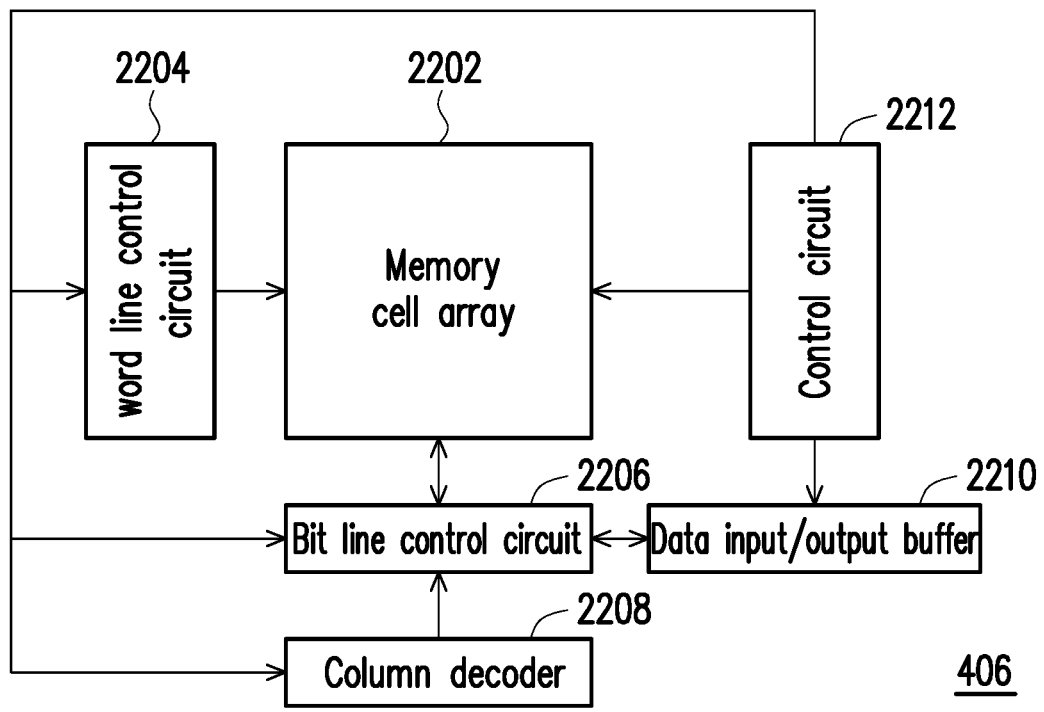
FIG. 5 is a schematic block diagram illustrating a rewritable non-volatile memory module according to an exemplary embodiment.
Figure 6:
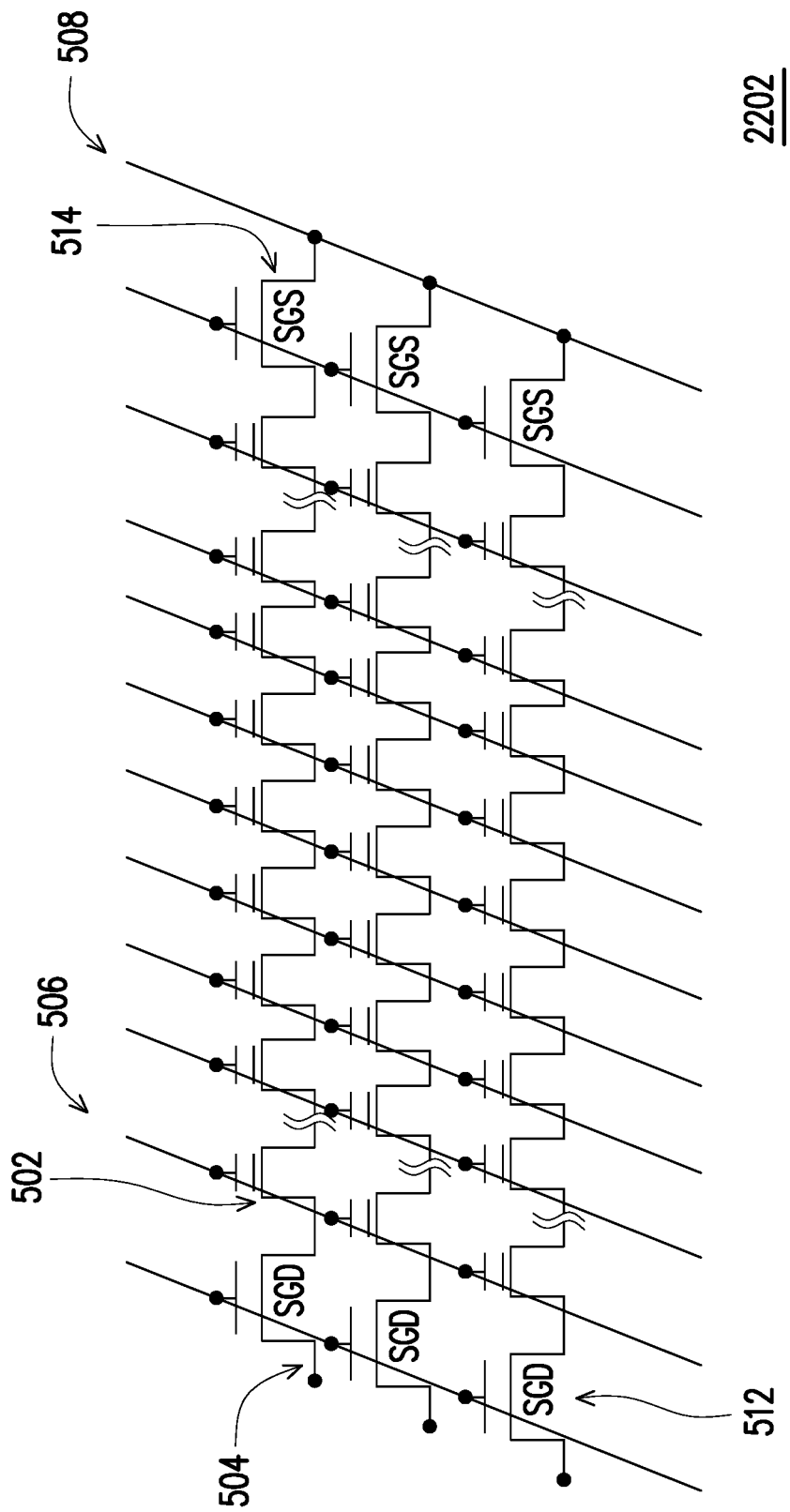
FIG. 6 is a schematic view illustrating a memory cell array according to an exemplary embodiment.

FIG. 5 is a schematic block diagram illustrating a rewritable non-volatile memory module according to an exemplary embodiment. FIG. 6 is a schematic view illustrating a memory cell array according to an exemplary embodiment.

Referring to FIGS. 5 and 6, the rewritable non-volatile memory module 406 includes a memory cell array 2202, a word line control circuit 2204, a bit line control circuit 2206, a column decoder 2208, a data input/output buffer 2210, and a control circuit 2212.

In the exemplary embodiment, the memory cell array 2202 may include a plurality of memory cells 502 for storing data, a plurality of select gate drain (SGD) transistors 512, a plurality of select gate source (SGS) transistors 514, and a plurality of bit lines 504, a plurality of word lines 506, and a plurality of common source lines 508 connecting the memory cells (as shown in FIG. 6). The memory cells 502 are disposed at intersections of the bit lines 504 and the word lines 506 as an array (or stacked three-dimensionally). When the memory control circuit unit 404 receives a write command or a read command, the control circuit 2212 may control the word line control circuit 2204, the bit line control circuit 2206, the column decoder 2208, the data input/output buffer 2210 to write data to the memory cell array 2202 or read data from the memory cell array 2202. The word line control circuit 2204 is configured to control a voltage applied to the word line 506, the bit line control circuit 2206 is configured to control a voltage applied to the bit line 504, the column decoder 2208 selects the corresponding bit line according to the column address in a command, and the data input/output buffer 2210 is configured to store data temporarily.

The memory cells in the rewritable non-volatile memory module 406 stores a plurality of bits by changing the threshold voltage. Specifically, a charge trapping layer is provided between the control gate and the channel of each memory cell. By applying a write voltage to the control gate, the quantity of electrons of the charge trapping layer is changed, and consequently the threshold voltage of the memory cell is changed. The process of changing the threshold voltage is also referred to "writing data to the memory cell" or "programming the memory cell". As the threshold voltage changes, each memory cell of the memory cell array 2202 has a plurality of storage states. Through the read voltage, the storage state to which the memory cell belongs can be determined, and the bit stored in the memory cell can be obtained.

Figure 7:
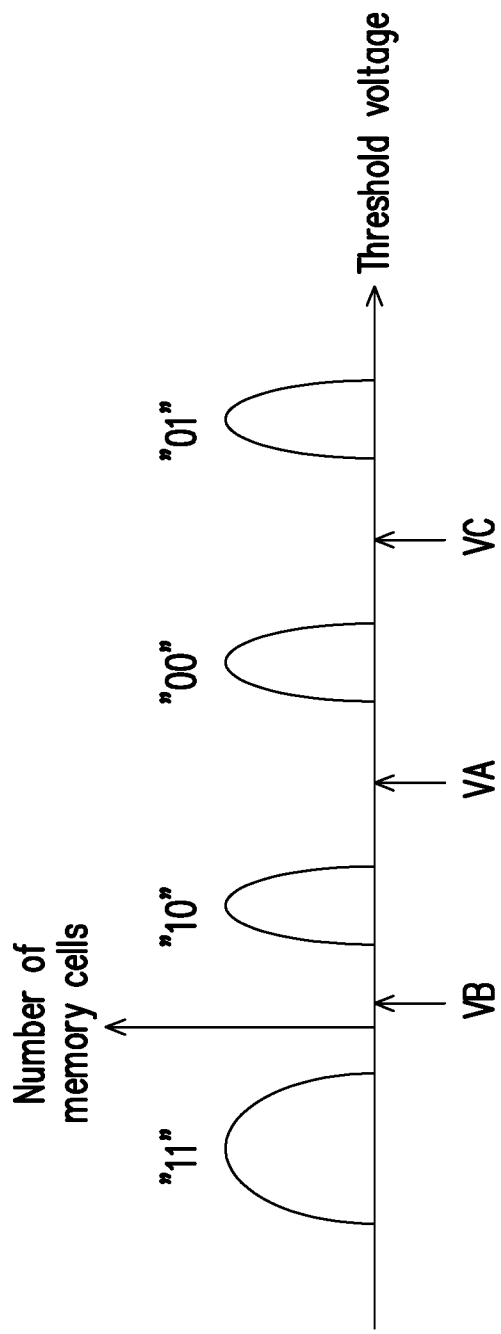
FIG. 7 is a diagram illustrating a statistical distribution of gate voltages corresponding to write data stored a memory cell array according to an exemplary embodiment.

FIG. 7 is a diagram illustrating a statistical distribution of gate voltages corresponding to write data stored a memory cell array according to an exemplary embodiment.

Referring to FIG. 7, taking a MLC NAND flash memory as an example, according to different threshold voltages, each memory cell has four storage states, and the storage states respectively represent bits such as "11", "10", "00", and "01". In other words, each storage state includes a least significant bit (LSB) and a most significant bit (MSB). In the exemplary embodiment, the first bit from the left side in the storage state (i.e., "11", "10", "00", and "01") is the LSB, and the second bit from the left side is the MSB. Therefore, in the exemplary embodiment, each memory cell may store two bits. It should be understood that the correspondence between the threshold voltages and the storage states shown in FIG. 7 merely serves as an example. In another exemplary embodiment of the invention, the correspondence between the threshold voltage and the storage states may be configured such that "11", "10", "01", and "00" are arranged from a lower threshold voltage to a higher threshold voltage, or the storage states may be arranged in other arrangements. Besides, in another exemplary embodiment, it may also be defined that the first bit from the left side is the MSB, and the second bit from the left side is the LSB.

In an exemplary embodiment in which each memory cell stores multiple bits (e.g., a MLC or TLC NAND flash memory module), physical programming units belonging to the same word line may be at least classified into a lower physical programming unit and an upper physical programming unit. For example, in the MLC NAND flash memory module, the LSB of a memory cell belongs to the lower physical programming unit, and the MSB of the memory cell belongs to the upper physical programming unit. In an exemplary embodiment, the lower physical programming unit is also referred to as a fast page, while the upper physical programming unit is also referred to as a slow page. Besides, in the TLC NAND flash memory module, the LSB of a memory cell belongs to the lower physical programming unit, a center significant bit (CSB) of the memory cell belongs to a middle physical programming unit, and the MSB of the memory cell belongs to the upper physical programming unit.

Figure 8:
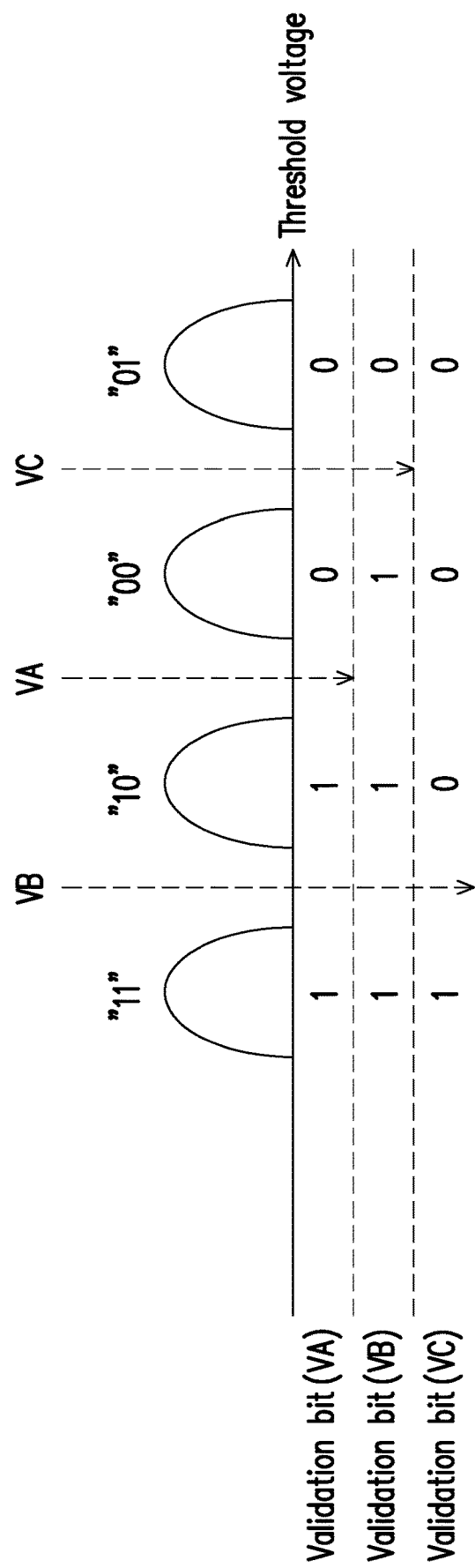
FIG. 8 is a schematic diagram illustrating reading data from memory cells according to an exemplary embodiment.

FIG. 8 is a schematic diagram illustrating reading data from memory cells according to an exemplary embodiment, and a MLC NAND flash memory is adopted as an example in FIG. 8.

Referring to FIG. 8, the read operation of the memory cells of the memory cell array 2202 is performed by applying read voltages VA to VC to the control gates and identifying the data stored in the memory cells according to the conducting states of the memory cell channels. A validation bit (VA) serves to indicate whether the memory cell channel is conducted when the read voltage VA is applied, a validation bit (VC) serves to indicate whether the memory cell channel is conducted when the read voltage VC is applied, and the validation bit (VB) serves to indicate whether the memory cell channel is conducted when the read voltage VB is applied. It is assumed herein that the corresponding memory cell channel is conducted when the validation bit is "1", and the corresponding memory cell channel is not conducted when the validation bit is "0". As shown in FIG. 8, through the validation bits (VA) to (VC), the storage state of the memory cell can be determined, and the bit that is stored can thus be obtained.

Figure 9:
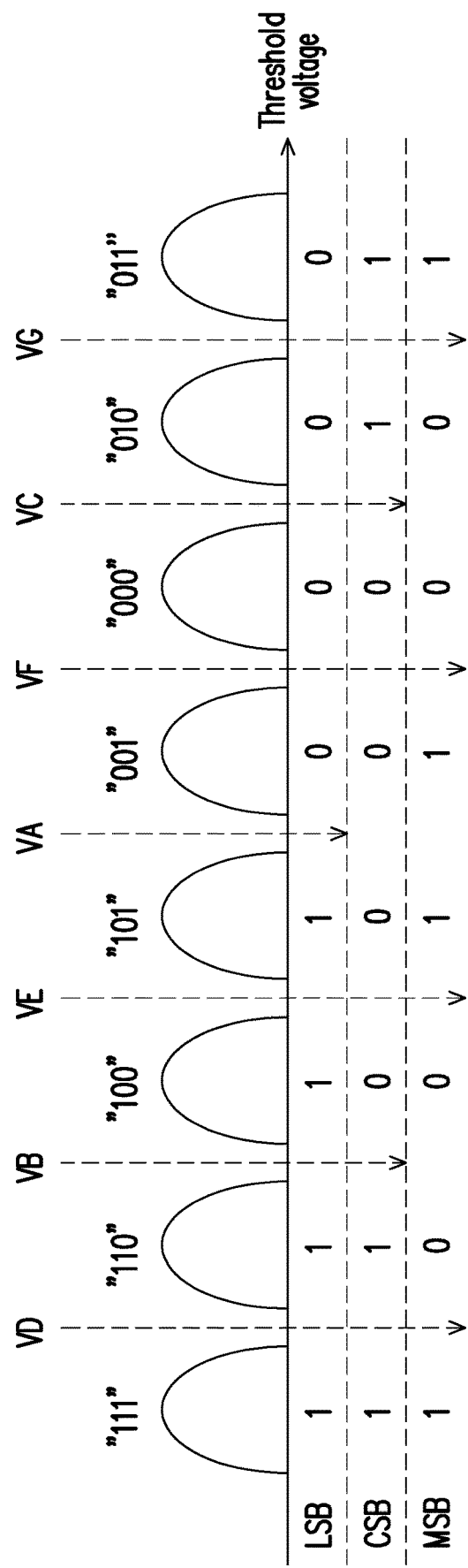
FIG. 9 is a schematic diagram illustrating reading data from memory cells according to another exemplary embodiment.

FIG. 9 is a schematic diagram illustrating reading data from memory cells according to another exemplary embodiment.

Referring to FIG. 9, taking a TLC NAND flash memory as an example, each storage state includes the least significant bit LSB, which is the first bit from the left side, the center significant bit CSB, which is the second bit from the left side, and the most significant bit MSB, which is the third bit from the left side. In the example, in correspondence with different threshold voltages, the memory cell has eight storage states (i.e., "111", "110", "100", "101", "001", "000", "010", and "011"). By applying read voltages VA to VG to the control gate, the bit stored in the memory cell can be identified.

It should be noted that the order of the eight storage states shown in FIG. 9 may be determined according to the design of the manufacturer, and shall not be limited to the order in the example.

Also, the memory cells of the rewritable non-volatile memory module 406 may form a plurality of physical programming units, and the physical programming units may form a plurality of physical erasing units. Specifically, memory cells on the same word line in FIG. 6 may form one or more physical programming units. For example, if the rewritable non-volatile memory module 406 is a MLC NAND flash memory module, the memory cells at the intersections of the same word line with the bit lines may form two physical programming units, i.e., the upper and lower physical programming units. In addition, the upper physical programming unit and the lower physical programming unit may be referred to as a physical programming unit set. Particularly, if the data to be read is located at a lower physical programming unit of a physical programming unit set, the read voltage VA in FIG. 8 may be adopted to identify the value of each bit in the lower physical programming unit. If the data to be read is located at an upper physical programming unit of a physical programming unit set, the read voltage VB and the read voltage VC in FIG. 8 may be adopted to identify the value of each bit in the upper physical programming unit.

Alternatively, if the rewritable non-volatile memory module 406 is a TLC NAND flash memory module, the memory cells at the intersections of the same word line with the bit lines may form three physical programming units, i.e., the upper physical programming unit, the middle physical programming unit, and the lower physical programming unit. In addition, the upper physical programming unit, the middle physical programming unit, and the lower physical programming unit may be referred to as a physical programming unit set. Particularly, if the data to be read is located at a lower physical programming unit of a physical programming unit set, the read voltage VA in FIG. 9 may be adopted to identify the value of each bit in the lower physical programming unit. If the data to be read is located at a middle physical programming unit of a physical programming unit set, the read voltage VB and the read voltage VC in FIG. 9 may be adopted to identify the value of each bit in the middle physical programming unit. If the data to be read is located at an upper physical programming unit of the physical programming unit set, the read voltage VD, the read voltage VE, the read voltage VF, and the read voltage VG in FIG. 9 may be adopted to identify the value of each bit in the upper physical programming unit.

In the exemplary embodiment, the physical programming unit is the minimum programming unit. In other words, the physical programming unit is the minimum unit for data writing. For example, the physical programming unit is a physical page or a physical sector. If the physical programming unit is a physical page, the physical programming units normally include a data bit region and a redundancy bit region. The data bit region includes a plurality of physical sectors and is configured to store user data, whereas the redundancy bit region serves to store system data (e.g., error checking/correcting code). In the exemplary embodiment, the data bit region includes 32 physical sectors, and the size of each physical sector is 512 bytes (Bs). However, in other exemplary embodiments, the data bit region may also include 8, 16, or more or fewer physical sectors, and the size of each physical sector may be greater or smaller. Meanwhile, the physical erasing unit is the minimum erasing unit. In other words, each physical erasing unit includes the minimum number of memory cells for being erased together. For example, the physical erasing unit may be a physical block.

FIG. 10 is a schematic diagram illustrating a physical erasing unit according to the exemplary embodiment.

Referring to FIG. 10, in the exemplary embodiment, it is assumed that one physical erasing unit is formed by a plurality of physical programming unit sets, and each physical programming unit set includes the lower physical programming unit, the middle physical programming unit, and the upper physical programming unit formed by memory cells arranged on the same word line. For example, in the physical erasing unit, the $0^{th}$ physical programming unit belonging to the lower physical programming unit, the $1^{st}$ physical programming unit belonging to the middle physical programming unit, and the $2^{nd}$ physical programming unit belonging to the upper physical programming unit are viewed as a physical programming unit set. Similarly, the $3^{rd}$, $4^{th}$, and $5^{th}$ physical programming units are viewed as a physical programming unit set, and by analogy, other physical programming units are also classified into a plurality of physical programming unit sets in this way.

Figure 11:
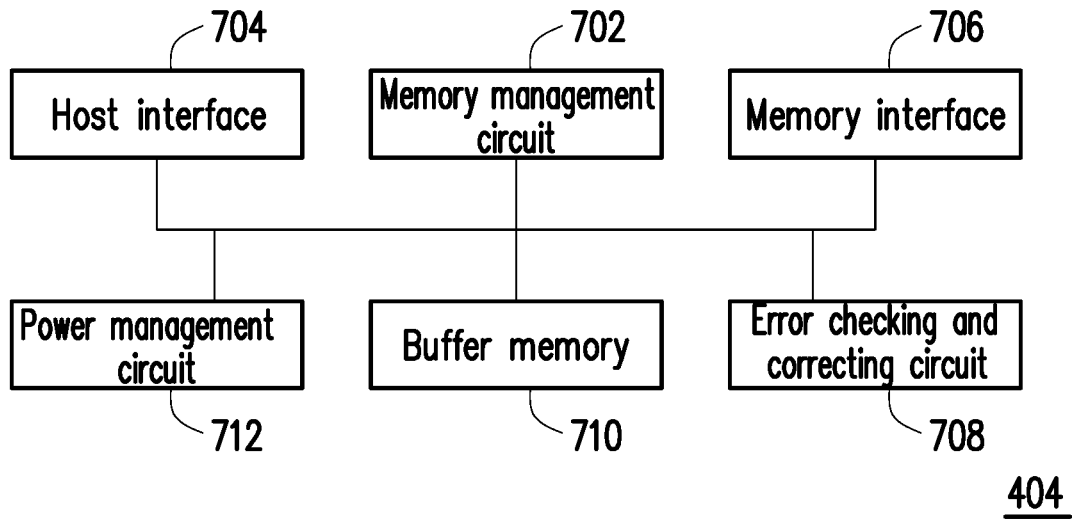
FIG. 11 is a schematic block diagram illustrating a memory control circuit unit according to an exemplary embodiment of the invention.

FIG. 11 is a schematic block diagram illustrating a memory control circuit unit according to an exemplary embodiment of the invention.

Referring to FIG. 11, the memory control circuit unit 404 includes a memory management circuit 702, a host interface 704, a memory interface 706, and an error checking and correcting circuit 708.

The memory management circuit 702 is configured to control the overall configuration of the memory control circuit unit 404. Specifically, the memory management circuit 702 has a plurality of control commands. When the memory storage device 10 is operated, the control commands are executed to perform various data operations such as data writing, data reading and data erasing. In the following, the descriptions about the operation of the memory management circuit 702 or any circuit component included in the memory control circuit unit 404 are equivalent to the descriptions about the operation of the memory control circuit unit 404.

In the exemplary embodiment, the control commands of the memory management circuit 702 are implemented as firmware. For instance, the memory management circuit 702 has a microprocessor unit (not shown) and a read-only memory (not shown), and the control commands are burnt into the read-only memory. When the memory storage device 10 is operated, the control commands are executed by the microprocessor unit for various operations, such as data writing, data reading or data erasing.

In another exemplary embodiment, the control commands of the memory management circuit 702 may also be stored as program codes in a specific region (e.g., the system region designated to store system data in the memory module) of the rewritable non-volatile memory module 406. Moreover, the memory management circuit 702 has a microprocessor unit (not shown), a read-only memory (not shown), and a random access memory (not shown). Specifically, the read-only memory has a boot code. When the memory control circuit unit 404 is enabled, the boot code is firstly executed by the microprocessor unit to load the control commands stored in the rewritable non-volatile memory module 406 to the random access memory of the memory management circuit 702. Afterwards, the microprocessor unit executes the control commands for various operation such as data writing, data reading and data erasing.

Besides, in another exemplary embodiment, the control commands of the memory management circuit 702 may also be implemented as hardware. For example, the memory management circuit 702 includes a microcontroller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the microcontroller. The memory cell management circuit is configured to management the memory cells of the rewritable non-volatile memory module 406 or the groups thereof. The memory write circuit is configured to issue a write command sequence to the rewritable non-volatile memory module 406 to write data to the rewritable non-volatile memory module 406. The memory read circuit is configured to issue a read command sequence to the rewritable non-volatile memory module 406 to read data from the rewritable non-volatile memory module 406. The memory erase circuit is configured to issue an erase command sequence to the rewritable non-volatile memory module 406 to erase data from the rewritable non-volatile memory module 406. The data processing circuit is configured to process data to be written to the rewritable non-volatile memory module 406 and data read from the rewritable non-volatile memory module 406. The write command sequence, the read command sequence and the erase command sequence may respectively include one or more program codes or command codes and serve to instruct the rewritable non-volatile memory module 406 to execute the corresponding writing, reading and erasing operations, etc. In an exemplary embodiment, the memory management circuit 702 may further issue other types of command sequences to the rewritable non-volatile memory module 406 to instruct the rewritable non-volatile memory module 406 to execute the corresponding operations.

The host interface 704 is coupled to the memory management circuit 702 and configured to receive and identify the command and data transmitted from the host system 11. In other words, the command and data transmitted from the host system 11 may be transmitted to the memory management circuit 702 through the host interface 704. In the exemplary embodiment, the host interface 704 is compatible with the SATA standard. However, the invention is not limited thereto. The host interface 704 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable data transmission standards.

The memory interface 706 is coupled to the memory management circuit 702 and is configured to access the rewritable non-volatile memory module 406. In other words, data to be written to the rewritable non-volatile memory module 406 is converted into a format acceptable to the rewritable non-volatile memory module 406 by the memory interface 706. Specifically, if the memory management circuit 702 intends to access the rewritable non-volatile memory module 406, the memory interface 706 may transmit the corresponding command sequence. For example, the command sequences may include the write command sequence instructing to write data, the read command sequence instructing to read data, the erase command sequence instructing to erase data, and the corresponding command sequences instructing to perform various memory operations (e.g., changing the read voltage level or executing a recycling process, etc.). The command sequences are, for example, generated by the memory management circuit 702 and transmitted to the rewritable non-volatile memory module 406 through the memory interface 706. These command sequences may include one or more signals, or data on a bus. The signals or data may include command codes or program codes. For example, the read command sequence may include information of reading identification codes, memory addresses, etc.

The error checking and correcting circuit 708 is coupled to the memory management circuit 702 and configured to execute an error checking and correcting process to ensure the accuracy of data. Specifically, when the memory management circuit 702 receives a write command from the host system 11, the error checking and correcting circuit 708 may generate a corresponding error correcting code (ECC) and/or error detecting code (EDC) for the data corresponding to the write command, and the memory management circuit 702 may write the data corresponding to the write command and the corresponding ECC and/or EDC to the rewritable non-volatile memory module 406. Afterwards, when reading data from the rewritable non-volatile memory module 406, the memory management circuit 702 may also read the ECC and/or EDC corresponding to the data, and the error checking and correcting circuit 708 may execute the error checking and correcting operation on the read data according to the ECC and/or EDC.

In an exemplary embodiment, the memory control circuit unit 404 further includes a buffer memory 710 and a power management circuit 712.

The buffer memory 710 is coupled to the memory management circuit 702 and configured to temporarily store data and commands from the host system 11 or data from the rewritable non-volatile memory module 406. The power management circuit 712 is coupled to the memory management circuit 702 and configured to control the power of the memory storage device 10.

Figure 12:
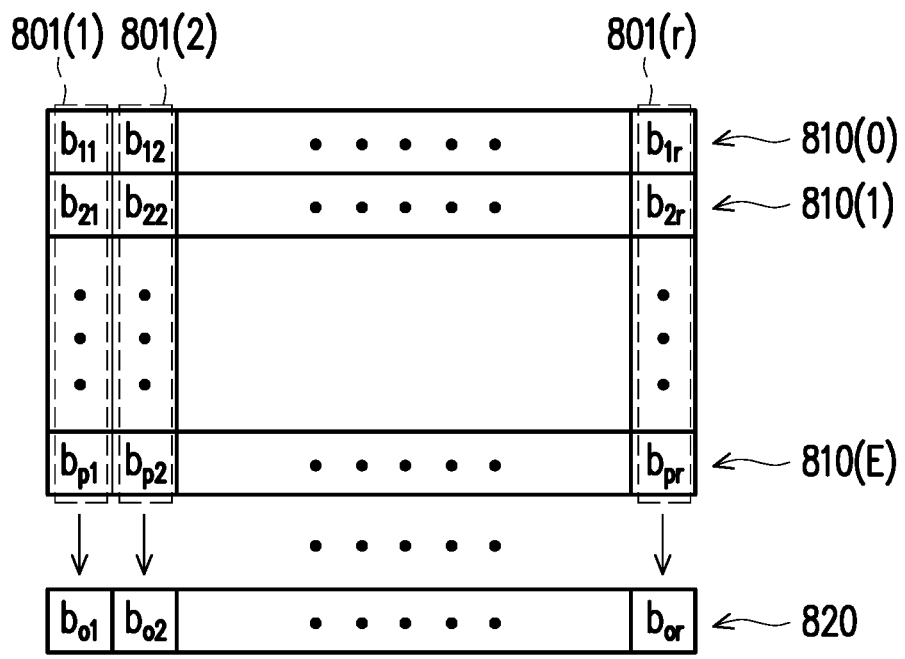
FIG. 12 is a schematic diagram illustrating multi-frame encoding according to an exemplary embodiment of the invention.

In the exemplary embodiment, the error checking and correcting circuit 708 may perform single-frame encoding on data stored in the same physical programming unit, and may also perform multi-frame encoding on data stored in a plurality of physical programming units. At least one of various encoding algorithms, such as low density parity codes (LDPC), BCH codes, convolutional codes, or turbo codes, etc., may be adopted for the single-frame encoding and multi-frame encoding. Alternatively, in an exemplary embodiment, the Reed-Solomon code (RS code) algorithm or the XOR algorithm may also be adopted for multi-frame encoding. Besides, in another exemplary embodiment, other encoding algorithms not listed above may also be adopted. Nevertheless, details in this regard will not be further elaborated in the following. According to the encoding algorithm that is adopted, the error checking and correcting circuit 708 may encode data to be protected, so as to generate the corresponding ECC and/or EDC. For the ease of description, the ECC and/or EDC generated through encoding will be generally referred to as encoded data in the following. FIG. 12 is a schematic diagram illustrating multi-frame encoding according to an exemplary embodiment of the invention.

Referring to FIG. 12, taking encoded data 820 generated in correspondence with encoding data stored in physical programming units 810(0) to 810(E) as an example, at least a portion of the data stored in each of the physical programming units 810(0) to 810(E) may be viewed as a frame. In multi-frame encoding, the data in the physical programming units 810(0) to 810(E) are encoded according to the location of each bit (or byte). For example, bits $b_{11}, b_{21}, \ldots, b_{p1}$ at a location 801(1) are encoded as a bit $b_{o1}$ in the encoded data 820, bits $b_{12}, b_{22}, \ldots, b_{p2}$ at a location 801(2) are encoded as a bit $b_{o2}$ in the encoded data 820, and by analogy, bits $b_{1r}, b_{2r}, \ldots, b_{pr}$ at a location 801(r) are encoded as a bit $b_{or}$ in the encoded data 820. Then, according to the encoded data 820, data read from the physical programming units 810(0) to 810(E) may be decoded to attempt to correct potential errors in the read data.

In addition, in another exemplary embodiment of FIG. 12, the data for generating the encoded data 820 may also include redundancy bits corresponding to data bits in the data stored in the physical programming units 810(0) to 810(E). Taking the data stored in the physical programming unit 810(0) as an example, the redundancy bits are generated by performing single-frame encoding on the data bits stored in the physical programming unit 810(0), for example. In the exemplary embodiment, it is assumed that when the data in the physical programming unit 810(0) is read, the data read from the physical programming unit 810(0) may be firstly decoded for error checking and correction by using the redundancy bits (e.g., the encoded data of single-frame encoding) in the physical programming unit 810(0). However, when decoding by using the redundancy bits in the physical programming unit 810(0) fails (e.g., the number of error bits of the data stored in the physical programming unit 810(0) after decoding is greater than a threshold), a retry-read mechanism may be adopted to attempt to read the correct data from the physical programming unit 810(0). Details regarding the retry-read mechanism will be separately described in the following. When the correct data cannot be read from the physical programming unit 810(0) through the retry-read mechanism, the encoded data 820 and the data of the physical programming units 810(1) to 810(E) may be read, and decoding may be performed according to the encoded data 820 and the data of the physical programming units 810(1) to 810(E) to attempt to correct the errors in the data stored in the physical programming unit 810(0). In other words, in the exemplary embodiment, when decoding by using the encoded data generated through single-frame encoding fails and reading by using the retry-read mechanism fails, decoding is performed by using encoded data generated through multi-frame encoding.

Figure 13:
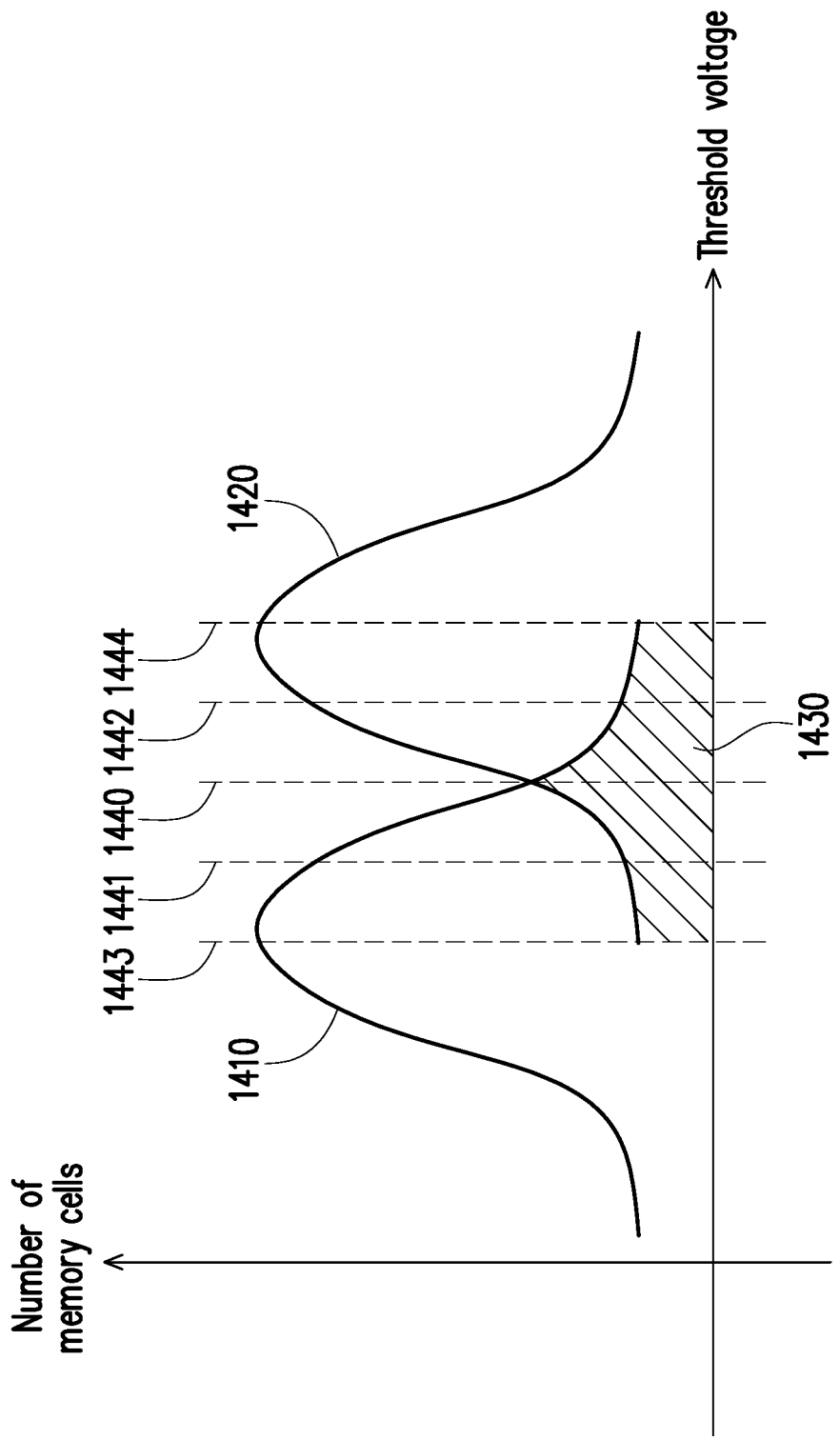
FIG. 13 is a schematic diagram illustrating a retry-read mechanism according to an exemplary embodiment.

Specifically, FIG. 13 is a schematic diagram illustrating a retry-read mechanism according to an exemplary embodiment.

Referring to FIG. 13, taking a SLC flash memory as an example, a distribution 1410 and a distribution 1420 serve to represent the storage states of a plurality of first memory cells, and the distribution 1410 and the distribution 1420 respectively represent different storage states. The first memory cells may belong to the same physical programming unit or different physical programming units. The invention does not intend to impose a limitation on this regard. Here, it is assumed that, when a memory cell belongs to the distribution 1410, the memory cell stores the bit "1", and when the memory cell belongs to the distribution 1420, the memory cell stores the bit "0". When the memory management circuit 702 reads the memory cell by using a read voltage 1440, the memory management circuit 702 may obtain a validation bit, and the validation bit serves to indicate whether the memory cell is conducted. Here, it is assumed that the validation bit is "1" when the memory cell is conducted, and the validation bit is "0" when the memory cell is not conducted. However, the invention is not limited thereto. If the validation bit is "1", the memory management circuit 702 may determine that the memory cell belongs to the distribution 1410, and if the validation bit is "0", the memory management circuit 702 may determine that the memory cell belongs to the distribution 1420. However, the distribution 1410 and the distribution 1420 are overlapped in a region 1430. In other words, some memory cells are supposed to belong to the distribution 1410 but are identified as belonging to the distribution 1420, while some other memory cells are supposed to belong to the distribution 1420 but are identified as belonging to the distribution 1410.

In the exemplary embodiment, when reading the memory cells, the memory management circuit 702 may firstly choose a preset read voltage (e.g., a read voltage 1441) to read the memory cells and obtain the validation bits of the memory cells. The error checking and correcting circuit 708 may execute the decoding operation according to the validation bits of the memory cells to generate a plurality of decoded bits, and the decoded bits may form decoded data (also referred to as a codeword).

If decoding fails, it is indicated that the memory cells store uncorrectable error bits. If decoding fails, in the retry-read mechanism, the memory management circuit 702 may obtain another read voltage, and read the first memory cells by using the another read voltage (e.g., a read voltage 1442), so as to obtain the validation bits of the memory cells again. The memory management circuit 702 may execute the decoding operation according to the validation bits obtained again to obtain another decoded data formed by a plurality of decoded bits. In an exemplary embodiment, the error checking and correcting circuit 708 may determine whether the another decoded data is a valid codeword according to a syndrome corresponding to the another decoded data. If the another decoded data is not a valid codeword, the memory management circuit 702 may determine that decoding fails. If the number of times of obtaining the read voltage does not exceed a preset number of times, the memory management circuit 702 may obtain another voltage again (e.g., a read voltage 1443), and read the memory cells according to the read voltage 1443 obtained again, so as to obtain the validation bits again and execute a first decoding operation.

In other words, when there is an uncorrectable error bit, the validation bits of some memory cells may be changed through obtaining the read voltage again, and there is a chance to change the decoding result of the decoding operation. Logically, the operation of obtaining the read voltage again is to flip some bits in a codeword and decode a new codeword again. Under some circumstances, by flipping a codeword that cannot be decoded (having uncorrectable error bits), the codeword may be decoded after flipping. Besides, in an exemplary embodiment, the memory management circuit 702 may try to decode for a certain number of times until the number of attempts exceeds the preset number of times. However, the invention does not intend to limit the preset number of times.

It should be noted that the decoding operation executed by using the encoded data generated through single-frame encoding may be classified into hard bit mode decoding and soft bit mode decoding. In the processes of both hard bit mode decoding and soft bit code encoding, decoding needs to be carried out according to "decoding initial values" of the memory cells. In the process of hard bit mode decoding, the decoding initial value of the memory cell is divided into two values (e.g., n and −n) according to a validation bit. For example, if the validation bit is "1", the memory management circuit 702 may set that the decoding initial value of the corresponding memory cell is −n, and if the validation bit is "0", the decoding initial value is n. In addition, n is a positive number. However, the invention does not intend to limit the value of the positive integer n. In other words, iterative decoding executed according to two values is referred to as hard bit mode decoding. However, the process of changing the read voltage may also be applied to soft bit mode decoding, where the decoding initial value of each memory cell is determined according to a plurality of validation bits. It should be noted that, regardless of the hard bit mode or the soft bit mode, the probability of a bit is calculated in the iterative decoding, so both modes belong to probabilistic decoding algorithms. Details for the processes of executing hard bit mode decoding and soft bit mode decoding are already taught in the conventional art, and will thus not be repeated in the following.

It should be noted that the example described with reference to FIG. 13 is an example of the SLC flash memory. However, the process of obtaining the read voltage again is also applicable to the MLC or TLC flash memory. As shown in FIG. 8, by changing the read voltage VA, the LSB of a memory cell is flipped, and by changing the read voltage VB or VC, the MSB of a memory cell is flipped. Therefore, a codeword may be changed into another codeword by changing the read voltage VA, VB, or VC. The result of changing the codeword is also applicable for the TLC flash memory of FIG. 9. The invention does not intend to limit whether the SLC, MLC, or TLC flash memory is used. It should be noted that the read voltages VA to VC may be generally referred to as a read voltage set. The memory management circuit 702 may, for example, choose one read voltage set from a plurality of read voltage sets to read the memory cells.

It should be noted that, in the embodiment, when intending to read a physical programming unit in the rewritable non-volatile memory module 406, the memory management circuit 702 may adopt a preset voltage set to read the physical programming unit and execute hard bit mode decoding according to the data read by using the preset voltage set. When decoding fails, the retry-read mechanism is executed to execute hard bit mode decoding again. When reading with the retry-read mechanism fails, the memory management circuit 702 may execute soft bit mode decoding. When soft bit mode decoding fails, the memory management circuit 702 may adopt the encoded data generated through multi-frame encoding to carry out decoding.

In particular, as the manufacturing process of the rewritable non-volatile memory module 406 progresses, there are more and more read voltage sets for the retry-read mechanism. Therefore, it has already taken a certain amount of time when the number of times of executing the retry-read mechanism exceeds the preset number of times. Hence, how to reduce the execution time of decoding has become an issue for researchers in the technical field to work on.

As a result, the exemplary embodiments of the invention provide a decoding method able to categorize the read voltage sets for the retry-read mechanism to obtain a plurality of read voltage categories and choose a suitable read voltage category from the read voltage categories to execute the retry-read mechanism, thereby avoiding a waste of time resulting from executing the retry-read mechanism using all the read voltage sets.

Figure 14:
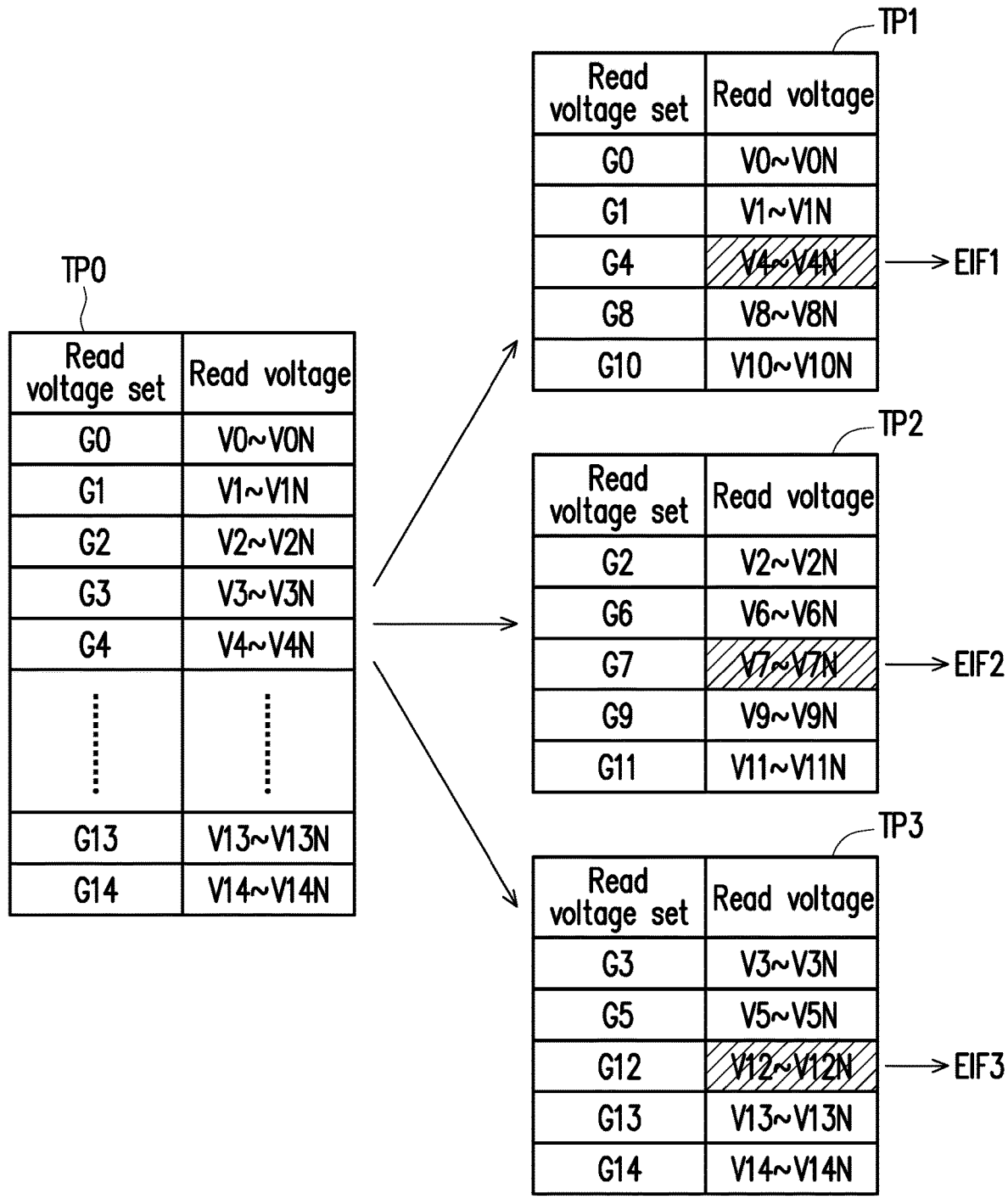
FIG. 14 is a schematic diagram illustrating categorization of read voltage sets according to an exemplary embodiment.

More specifically, FIG. 14 is a schematic diagram illustrating categorization of read voltage sets according to an exemplary embodiment.

Referring to FIG. 14, it is assumed that the supplier of the rewritable non-volatile memory module 406 provides an original read voltage set table TP0 for executing the retry-read mechanism. The original read voltage set table TP0 includes read voltage sets G0 to G14, for example. The read voltage set G0 includes read voltages V0 to V0N, and the read voltage set G1 includes read voltages V1 to V1N, and so on so forth. In the embodiment, before the memory storage device 10 is shipped out of the factory, the manufacturer of the memory storage device 10 may, for example, categorize the read voltage sets G0 to G14 in the original read voltage set table TP0 by using the memory management circuit 702 to obtain, for example, read voltage categories TP1 to TP3, and configure the read voltage categories TP1 to TP3 in the memory storage device 10 through the memory management circuit 702. The read voltage category TP1 may include the read voltage sets G0, G1, G4, G8, and G10. The read voltage category TP2 may include the read voltage sets G2, G6, G7, G9, and G11. The read voltage category TP3 may include the read voltage sets G3, G5, G12, G13, and G14. It should be noted that, in other embodiments, the same read voltage set may simultaneously belong to different read voltage categories. Besides, each read voltage category may include a representative read voltage set. For example, the read voltage category TP1 may include the representative read voltage set G4 (i.e., read voltages V4 to V4N), the read voltage category TP2 may include the representative read voltage set G7 (i.e., read voltages V7 to V7N), and the read voltage category TP3 may include the representative read voltage set G12 (i.e., read voltages V12 to V12N).

Figure 15:
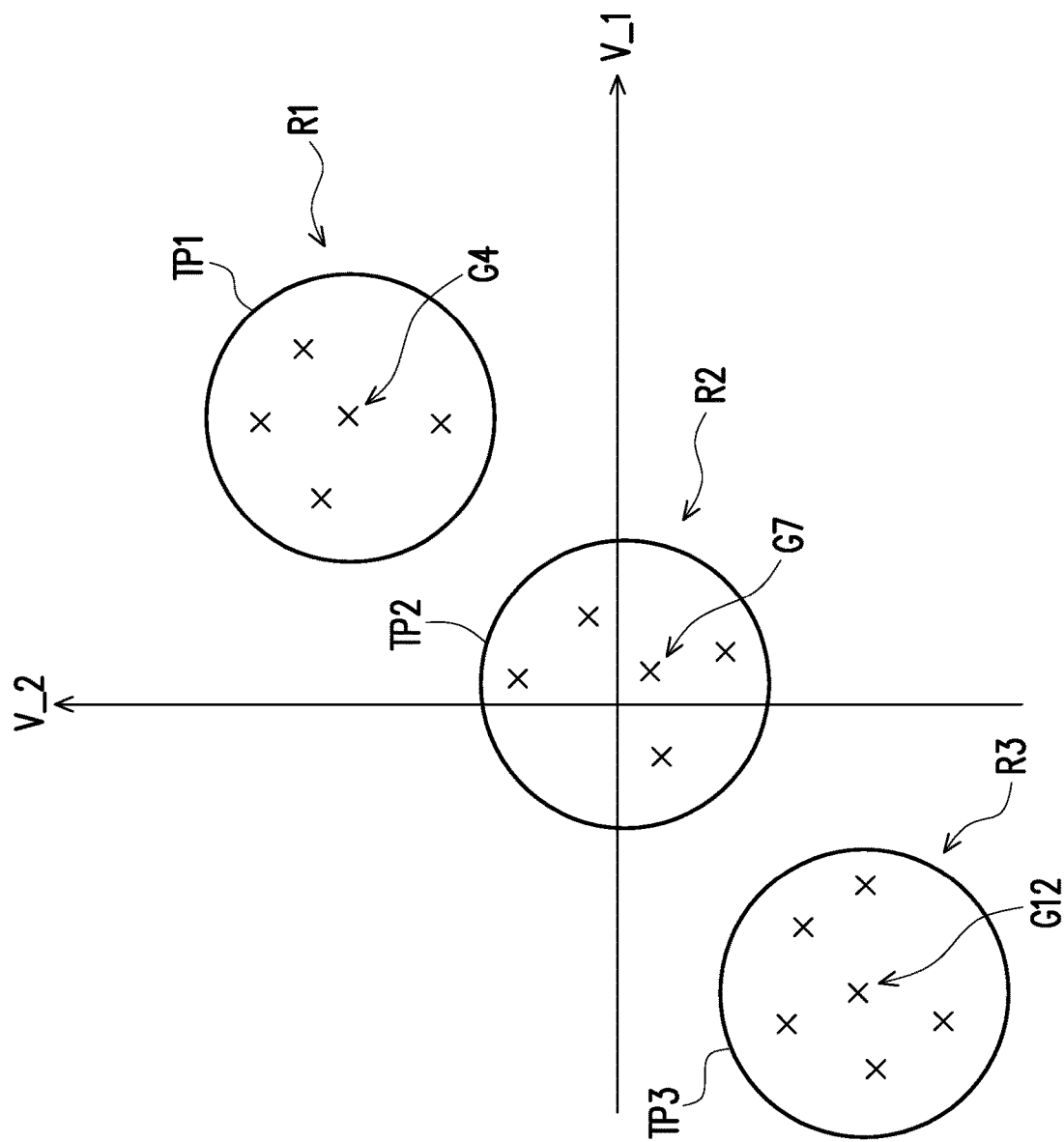
FIG. 15 is a schematic diagram illustrating a voltage distribution according to an exemplary embodiment.

FIG. 15 is a schematic diagram illustrating a voltage distribution according to an exemplary embodiment.

Referring to FIG. 15, it is assumed that a voltage V_1 on the horizontal axis and a voltage V_2 on the vertical axis in the voltage distribution shown in FIG. 15 are read voltages for reading a physical programming unit (e.g., the lower physical programming unit). Assuming that the read voltage sets G0 to G14 are marked with "X" and distributed in the voltage distribution shown in FIG. 15, the read voltage categories TP1 to TP3 may respectively correspond to voltage distribution ranges R1 to R3 in the voltage distribution shown in FIG. 15, and the representative read voltage set G4, the representative read voltage set G7, and the representative read voltage set G12 are respectively located at the centers of the voltage distribution ranges R1 to R3. In other words, each representative read voltage set has the minimum sum of distances to other read voltage sets in the voltage distribution range to which the representative read voltage set belongs. For example, the representative read voltage set G4 has the minimum sum of distances to other read voltage sets in the voltage distribution range R1 to which the representative read voltage set G4 belongs. The representative read voltage set G7 has the minimum sum of distances to other read voltage sets in the voltage distribution range R2 to which the representative read voltage set G7 belongs. The representative read voltage set G12 has the minimum sum of distances to other read voltage sets in the voltage distribution range R3 to which the representative read voltage set G12 belongs.

It should be noted that the read voltage sets G0 to G14 may be categorized according to at least one of the wear degree value (e.g., the total of the number of times of read and the number of times of write) of the rewritable non-volatile memory module 406, the duration of time during which data may be stored in the rewritable non-volatile memory module 406, the temperature difference between the write temperature and the read temperature of the rewritable non-volatile memory module 406, and the number of times of read in which a read-disturb occurs in the rewritable non-volatile memory module 406, for example. After the read voltage sets categorized into the same category (i.e., being in the same read voltage category) are adopted for reading and decoding, the numbers of error bits in the decoded data are close. It should be noted that, when data stored in the same physical block are read multiple times, such as thousands or millions of times of read, it is likely that the read data are erroneous, or even the data stored in the block that is read multiple times may be anomalous or lost. Such a phenomenon is referred to as a "read-disturb" by people of ordinary skills in the art.

Referring to FIG. 14, when the memory management circuit 702 reads a physical programming unit (also referred to as a first physical programming unit), the memory management circuit 702 may read the first physical programming unit by respectively using the representative read voltage sets G4, G7, and G12 of the read voltage categories TP1 to TP3 and executing a decoding operation (e.g., hard bit mode decoding), so as to obtain decoded information EIF1, decoded information EIF2, and decoded information EIF3. In an embodiment, the decoded information EIF1 to EIF3 are syndrome sums obtained through LDPC decoding, for example. Details concerning how the syndrome sums are obtained through LDPC decoding have been taught in the conventional art and therefore will not be repeated in the following.

It should be noted that the magnitude of the syndrome sum is related to the number of error bits in data. For example, the greater the syndrome sum, the greater the number of error bits in data, and the smaller the syndrome sum, the smaller the number of error bits in data. Therefore, when the decoded information EIF1 to EIF3 are syndrome sums, it is assumed that the syndrome sums of the decoded information EIF1 and the decoded information EIF2 (generally referred to as first decoded information) are smaller than a first threshold, and the syndrome sum of the decoded information EIF3 is not smaller than the first threshold. At this time, the memory management circuit 702 may determine that adopting the read voltage categories TP1 to TP2 (also referred to as first representative read voltage categories) to which the representative read voltage sets G4 and G7 (also referred to as first representative read voltage sets) used to obtain the decoded information EIF1 to EIF2 belong for the retry-read mechanism may render a higher chance of successful decoding, and adopting the read voltage category TP3 to which the representative read voltage set G12 used to obtain the decoded information EIF3 belongs has a lower chance of successful decoding. Therefore, the memory management circuit 702 may read the first physical programming unit according to the read voltages (also referred to as first read voltages) in the read voltage categories TP1 and TP2 and execute the decoding operation of the retry-read mechanism. Besides, since the chance of successful decoding by using the read voltage category TP3 for the retry-read mechanism is lower, in the embodiment, the read voltage category TP3 is not used to read the first physical programming unit and execute the decoding operation of the retry-read mechanism. It should be noted that the invention is not limited to the first threshold.

However, in other embodiments, the decoded information EIF1 to EIF3 is, for example, the count of the bit value "1" (also referred to as a first bit value) in the read data. It should be noted that, in general, when data is written to a physical programming unit, the data is randomized through a randomizer, so that the count of the bit value "0" and the count of the bit value "1" are equal. In this way, the lifespan of the memory cells in the rewritable non-volatile memory module 406 may be longer. Therefore, the memory management circuit 702 may set a half of the number of bits stored in a physical programming unit as a preset value. When the difference between the count of the bit value "1" in the read data and the preset value is greater than a second threshold, it is determined that the chance of successfully decoding the data is lower. Comparatively, when the difference between the count of the bit value "1" in the read data and the preset value is not greater than the second threshold, it is determined that the chance of successfully decoding the data is higher. It should be noted that, in other embodiments, the first bit value may also be the count of the bit value "0".

In the embodiment, the decoded information EIF1 to EIF3 is the count of the bit value "1" in the read data. Assuming that the difference between the count of the bit value "1" recorded in the decoded information EIF1 and the preset value is not greater than the second threshold, and the difference between the count of the bit value "1" recorded in the decoded information EIF2 and the preset value is not greater than the second threshold, the memory management circuit 702 may determine that the read voltage categories TP1 to TP2 to which the representative read voltage set G4 and the representative read voltage set G7 used to obtain the decoded information EIF1 and EIF2 belong have a higher chance of successful decoding. Besides, assuming that the difference between the count of the bit value "1" recorded in the decoded information EIF3 and the preset value is greater than the second threshold, the read voltage category TP3 to which the representative read voltage set G12 used to obtain the decoded information EIF3 belongs has a lower chance of successful decoding. Therefore, the memory management circuit 702 may read the first physical programming unit according to the read voltages in the read voltage categories TP1 and TP2 and execute the decoding operation of the retry-read mechanism. Besides, since the chance of successful decoding by using the read voltage category for the retry-read mechanism is lower, in the embodiment, the read voltage category TP3 is not used to read the first physical programming unit and execute the decoding operation of the retry-read mechanism. It should be noted that the invention is not limited to the second threshold.

Figure 16:
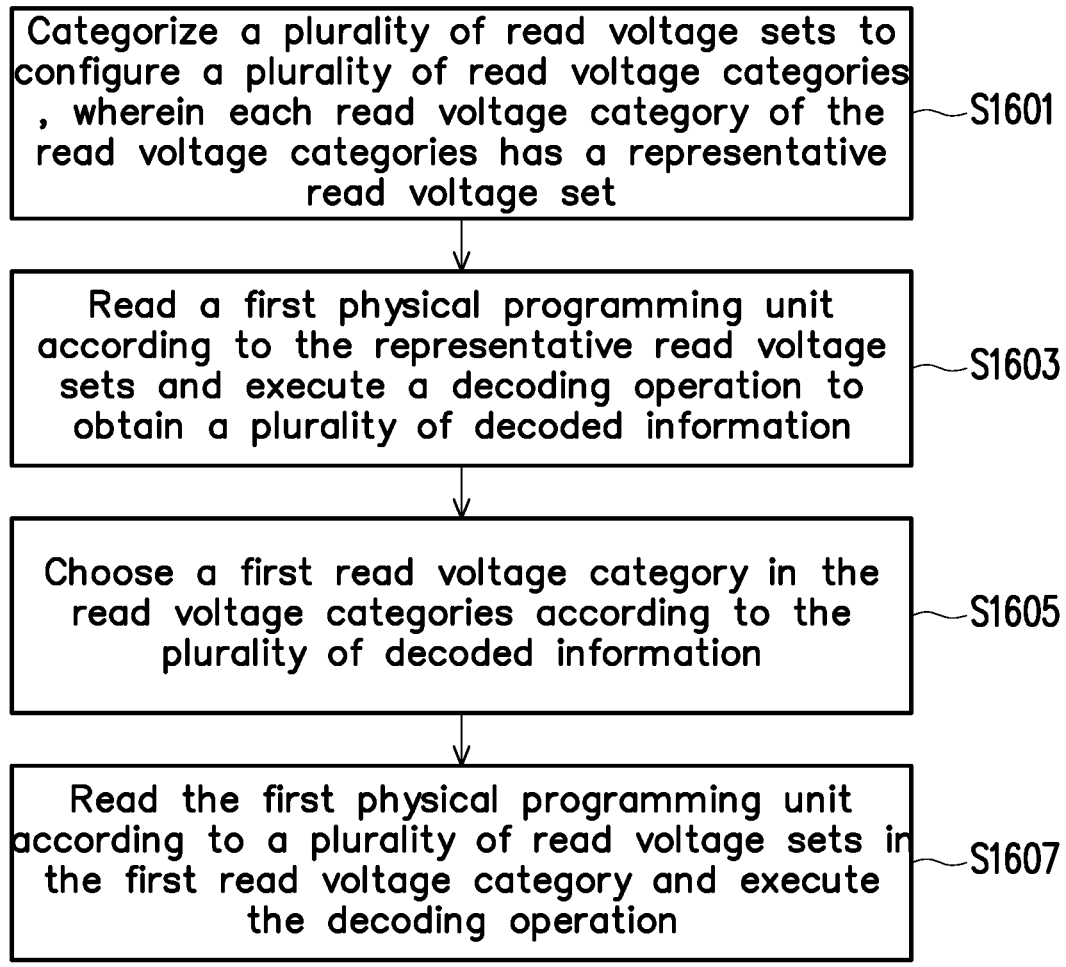
FIG. 16 is a flowchart illustrating a decoding method according to an exemplary embodiment.

FIG. 16 is a flowchart illustrating a decoding method according to an exemplary embodiment.

Referring to FIG. 16, in step S1601, the memory management circuit 702 categorizes the read voltage sets to configure the read voltage categories. In addition, each read voltage category of the read voltage categories has a representative read voltage set. In step S1603, the memory management circuit 702 reads the first physical programming unit according to the representative read voltage sets and executes the decoding operation to obtain a plurality of decoded information. In step S1605, the memory management circuit 702 chooses the first read voltage category in the read voltage categories according to the decoded information. In step S1607, the memory management circuit 702 reads the first physical programming unit according to the read voltage sets in the first read voltage category and executes the decoding operation.

In view of the foregoing, the decoding method, the memory control circuit unit, and the memory storage device according to the embodiments of the invention are able to categorize the read voltage sets for the retry-read mechanism to obtain the read voltage categories and choose a suitable read voltage category from the read voltage categories to execute the retry-read mechanism, thereby avoiding a waste of time resulting from executing the retry-read mechanism using all the read voltage sets.

The previously described exemplary embodiments of the present disclosure have the advantages aforementioned, wherein the advantages aforementioned not required in all versions of the disclosure.

It may be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A decoding method for a rewritable non-volatile memory module, wherein the rewritable non-volatile memory module has a plurality of physical erasing units, each physical erasing unit of the physical erasing units has a plurality of physical programming units, and the decoding method comprises:

configuring a plurality of read voltage categories, wherein each read voltage category of the read voltage categories comprises a plurality of read voltage sets, and each read voltage category of the read voltage categories has a representative read voltage set;

reading a first physical programming unit according to the representative read voltage sets and executing a decoding operation to obtain a plurality of decoded information;

choosing a first read voltage category in the read voltage categories according to the plurality of decoded information; and reading the first physical programming unit according to the read voltage sets in the first read voltage category and executing the decoding operation.

2. The decoding method as claimed in claim 1, wherein a read voltage category other than the first read voltage category in the read voltage categories is not adopted to read the first physical programming unit and execute the decoding operation.

3. The decoding method as claimed in claim 1, wherein the read voltage sets are categorized according to at least one of a wear degree value of the rewritable non-volatile memory module, a duration of time during which data is stored in the rewritable non-volatile memory module, a temperature difference between a write temperature and a read temperature of the rewritable non-volatile memory module, and a number of times of read in which a read-disturb occurs in the rewritable non-volatile memory module.

4. The decoding method as claimed in claim 1, wherein each decoded information of the plurality of decoded information comprises a syndrome sum or a count of a first bit value in data that is read.

5. The decoding method as claimed in claim 4, wherein the syndrome sum of the first decoded information is smaller than a first threshold, and the syndrome sum of decoded information other than the first decoded information in the plurality of decoded information is not smaller than the first threshold.

6. The decoding method as claimed in claim 4, wherein a difference between the count of the first bit value of the first decoded information and a preset value is smaller than a second threshold, and a difference between the count of the first bit value of decoded information other than the first decoded information in the plurality of decoded information and the preset value is not smaller than the second threshold.

7. The decoding method as claimed in claim 6, wherein the present value is a half of the number of bits of data stored in the first physical programming unit.

8. The decoding method as claimed in claim 1, wherein the read voltage sets are distributed in a voltage distribution, the read voltage categories respectively correspond to a plurality of voltage distribution ranges in the voltage distribution, and each representative read voltage set of the representative read voltage sets has a minimum sum of distances to other read voltage sets in the voltage distribution range to which the each representative read voltage set belongs.

9. A memory control circuit unit for a rewritable non-volatile memory module, wherein the rewritable non-volatile memory module has a plurality of physical erasing units, each physical erasing unit of the physical erasing units has a plurality of physical programming units, and the memory control circuit unit comprises:
a host interface, configured to be coupled to a host system;
a memory interface, configured to be coupled to the rewritable non-volatile memory module; and
a memory management circuit, coupled to the host interface and the memory interface,
wherein the memory management circuit configures a plurality of read voltage categories, each read voltage category of the read voltage categories comprises a plurality of read voltage sets, and each read voltage category of the read voltage categories has a representative read voltage set,
wherein the memory management circuit is further configured to read a first physical programming unit according to the representative read voltage sets and execute a decoding operation to obtain a plurality of decoded information,
wherein the memory management circuit is further configured to choose a first read voltage category in the read voltage categories according to the plurality of decoded information, and
wherein the memory management circuit is further configured to read the first physical programming unit according to the read voltage sets in the first read voltage category and execute the decoding operation.

10. The memory control circuit unit as claimed in claim 9, wherein a read voltage category other than the first read voltage category in the read voltage categories is not adopted to read the first physical programming unit and execute the decoding operation.

11. The memory control circuit unit as claimed in claim 9, wherein the read voltage sets are categorized according to at least one of a wear degree value of the rewritable non-volatile memory module, a duration of time during which data is stored in the rewritable non-volatile memory module, a temperature difference between a write temperature and a read temperature of the rewritable non-volatile memory module, and a number of times of read in which a read-disturb occurs in the rewritable non-volatile memory module.

12. The memory control circuit unit as claimed in claim 9, wherein each decoded information of the plurality of decoded information comprises a syndrome sum or a count of a first bit value in data that is read.

13. The memory control circuit unit as claimed in claim 12, wherein the syndrome sum of the first decoded information is smaller than a first threshold, and the syndrome sum of decoded information other than the first decoded information in the plurality of decoded information is not smaller than the first threshold.

14. The memory control circuit unit as claimed in claim 9, wherein a difference between the count of the first bit value of the first decoded information and a preset value is smaller than a second threshold, and a difference between the count of the first bit value of decoded information other than the first decoded information in the plurality of decoded information and the preset value is not smaller than the second threshold.

15. The memory control circuit unit as claimed in claim 14, wherein the present value is a half of the number of bits of data stored in the first physical programming unit.

16. The memory control circuit unit as claimed in claim 9, wherein the read voltage sets are distributed in a voltage distribution, the read voltage categories respectively correspond to a plurality of voltage distribution ranges in the voltage distribution, and each representative read voltage set of the representative read voltage sets has a minimum sum of distances to other read voltage sets in the voltage distribution range to which the each representative read voltage set belongs.

17. A memory storage device, comprising:
a connection interface unit, coupled to a host system;
a rewritable non-volatile memory module, wherein the rewritable non-volatile memory module has a plurality of physical erasing units, and each physical erasing unit of the physical erasing units has a plurality of physical programming units; and
a memory control circuit unit, coupled to the connection interface unit and the rewritable non-volatile memory module,
wherein the memory control circuit unit configures a plurality of read voltage categories, each read voltage category of the read voltage categories comprises a plurality of read voltage sets, and each read voltage category of the read voltage categories has a representative read voltage set,
wherein the memory control circuit unit is further configured to read a first physical programming unit according to the representative read voltage sets and execute a decoding operation to obtain a plurality of decoded information,
wherein the memory control circuit unit is further configured to choose a first read voltage category in the read voltage categories according to the plurality of decoded information, and
wherein the memory control circuit unit is further configured to read the first physical programming unit according to the read voltage sets in the first read voltage category and execute the decoding operation.

18. The memory storage device as claimed in claim 17, wherein a read voltage category other than the first read voltage category in the read voltage categories is not adopted to read the first physical programming unit and execute the decoding operation.

19. The memory storage device as claimed in claim 17, wherein the read voltage sets are categorized according to at least one of a wear degree value of the rewritable non-volatile memory module, a duration of time during which data is stored in the rewritable non-volatile memory module, a temperature difference between a write temperature and a read temperature of the rewritable non-volatile memory module, and a number of times of read in which a read-disturb occurs in the rewritable non-volatile memory module.

20. The memory storage device as claimed in claim 17, wherein each decoded information of the plurality of decoded information comprises a syndrome sum or a count of a first bit value in data that is read.

21. The memory storage device as claimed in claim 20, wherein the syndrome sum of the first decoded information is smaller than a first threshold, and the syndrome sum of decoded information other than the first decoded information in the plurality of decoded information is not smaller than the first threshold.

22. The memory storage device as claimed in claim 20, wherein a difference between the count of the first bit value of the first decoded information and a preset value is smaller than a second threshold, and a difference between the count of the first bit value of decoded information other than the first decoded information in the plurality of decoded information and the preset value is not smaller than the second threshold.

23. The memory storage device as claimed in claim 22, wherein the present value is a half of the number of bits of data stored in the first physical programming unit.

24. The memory storage device as claimed in claim 17, wherein the read voltage sets are distributed in a voltage distribution, the read voltage categories respectively correspond to a plurality of voltage distribution ranges in the voltage distribution, and each representative read voltage set of the representative read voltage sets has a minimum sum of distances to other read voltage sets in the voltage distribution range to which the each representative read voltage set belongs.

\* \* \* \* \*